United States Patent Office 3,556,793

Patented Jan. 19, 1971

3,556,793

NOVEL SUBSTITUTED ALLYL POLYMER DERIVATIVES USEFUL AS PHOTORESISTS

Nathan D. Field, Allentown, and Harlan Benjamin Freyermuth, Easton, Pa., assignors to GAF Corporation, New York, N.Y., a corporation of Delaware

No Drawing. Filed May 22, 1968, Ser. No. 731,280

Int. Cl. G03c *1/68, 1/69*

U.S. Cl. 96—35.1 14 Claims

ABSTRACT OF THE DISCLOSURE

Light-sensitive, organic solvent-soluble, film-forming substituted allyl containing polymers suitable for use as photoresists.

This invention relates to novel light-sensitive, organic solvent-soluble substituted allyl group containing polymers, and their preparation by reaction of substituted allyl compounds with certain polymeric intermediates containing reactive groups to form novel light-sensitive, organic solvent-soluble polymers.

The invention also relates to the use of said light-sensitive polymers as photoresists wherein, after coating on suitable surfaces, their propensity to crosslink (i.e. polymerize) under the action of actinic radiation is used to form organic solvent-insoluble compounds. Subsequent removal from the surface of the unexposed portion of the polymer coating by organic solvent development leaves intact thereon the exposed, crosslinked polymer. Such photoresists are useful, for example, in the manufacture of printed circuits, for making printing plates, for making semiconductors for integrated circuits and for other analogous functions.

To provide the aforesaid crosslinking ability, polymers suitable for photoresists usually contained pendant groups which had a degree of unsaturation and, vicinal thereto, an electron withdrawing group. Early work on this phenomenon of light sensitivity involved compounds containing cinnamic acid residues and derivatives thereof as, for example, the following:

cinnamoyl polystyrene resin,

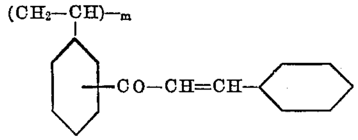

cinnamic acid esters of polyvinyl alcohol,

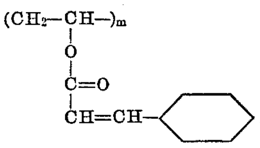

a copolymer of styrene-maleic anhydride esterified with N-(m-hydroxymethylphenyl)-cinnamamide,

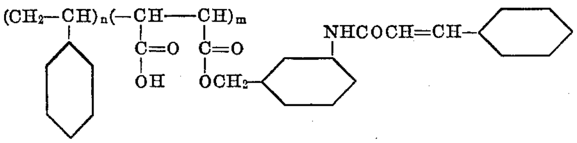

and the reaction product of vinyl acetate/maleic anhydride with 3-aminobenzalacetophenone

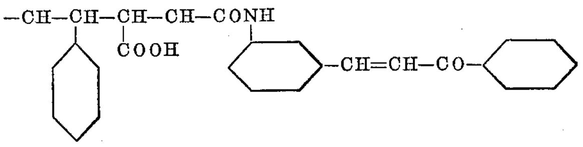

Heretofore, it was thought that a requirement for light-sensitive polymers of the aforesaid classes—in particular, cinnamyl polymers—was the presence of a conjungated system resulting from the location of the carbonyl group adjacent to the carbon-carbon double bond. However, by the process of this invention, compounds suitable for photoresist have been prepared in which no such conjugated system is present.

It was known heretofore to prepare photo-sensitive materials containing esters of resinous copolymers of maleic acid, as set out in U.S. Pats. 2,980,534 and 2,990,-281, but as disclosed in these references, these materials required inclusion with the copolymer esters of photo-sensitive diazo compounds, dichromates, iron systems, iron-silver systems, silver salts or mixtures thereof.

This invention is based on the discovery that certain substituted allyl compounds form, with copolymers of maleic anhydride, polymers of acid halides or polymers of unsaturated acids, light-sensitive, solvent-soluble polymers which are excellent materials for photoresists in the absence of other light sensitive compounds.

This invention is also based on the discovery that the aforesaid light-sensitive compounds are suitable as photoresists in the ultraviolet region with or without the addition of sensitizers which enhance or modify the light-sensitivity of said compounds.

The substituted allyl compounds which are the preferred reactants of this invention have the general formula:

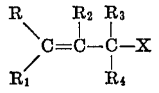

in which R is hydrogen, aryl, alkyl, or alkyl-substituted aryl in which in both cases the alkyl substituent has from 1 to 3 carbon atoms, fluorine, bromine, chlorine, carboxy or sulfonic acid;

$R_1$ is hydrogen, aryl, alkyl, alkoxy, aryloxy, or mono-, di-, or tri-substituted aryl or aryloxy in which the substituents can be hydroxy, alkyl or alkoxy containing from 1 to 3 carbon atoms; benzyloxy, fluoro, chloro, bromo, nitro, carboxy, sulfonic acid, furyl, cycloalkyl, aliphatic carboacyl, aliphatic carboacyloxy, aroyl, aroyloxy, cyano, alkyl sulfonyl, aryl sulfonyl, carbalkoxy or like groups;

$R_2$ is hydrogen, alkyl, alkoxy, alkoxymethylene, aryl, aryloxy or alkyl-substituted aryl or aryloxy wherein the alkyl substituent in all cases contains no more than 2 carbon atoms;

$R_3$ and $R_4$ are hydrogen, aryl, substituted aryl wherein the substituents can be alkyl or alkoxy of 1 to 3 carbon atoms, chloro, bromo, nitro, amino, or alkyl sulfonyl; and X is hydroxy, amino, monoalkylamino, monoalkenylamino, monoarylamino or mercapto.

In addition, when R and $R_1$ are hydrogen or alkyl at least one of the radicals $R_2$, $R_3$ and $R_4$ is a substituent other than hydrogen or alkyl.

Examples of some such compounds are:

3-phenyl-2-propen-1-ol
3-(hydroxyphenyl)-2-propen-1-ol
3-(2-hydroxyphenyl)-2-propen-1-ol
3-(3,4-dihydroxyphenyl)-2-propen-1-ol
3-(2,4-dihydroxyphenyl)-2-propen-1-ol
3-(3,4,5-trihydroxyphenyl)-2-propen-1-ol 3-(3-methoxy-4-hydroxyphenyl)-2-propen-1-ol
3-(3,4-dihydroxy-5-methoxyphenyl)-2-propen-1-ol
3-(3,5-dimethoxy-4-hydroxyphenyl)-2-propen-1-ol
3-(2-hydroxy-4-methylphenyl)-2-propen-1-ol
3-(4-methoxyphenyl)-2-propen-1-ol
3-(4-ethoxyphenyl)-2-propen-1-ol
3-(2-methoxyphenyl)-2-propen-1-ol
3-(3,4-dimethoxyphenyl)-2-propen-1-ol
3-(3-methoxy-4-propoxyphenyl)-2-propen-1-ol
3-(2,4,6-trimethoxyphenyl)-2-propen-1-ol
3-(3-methoxy-4-benzyloxyphenyl)-2-propen-1-ol
3-(3-(3'methoxyphenyl)-4-benzyloxyphenyl)-2-propen-1-ol
3-phenoxy-3-phenyl-2-propen-1-ol
3-(3,4,5-trimethoxyphenyl)-2-propen-1-ol
3-(4-methylphenyl)-2-propen-1-ol
3-phenyl-3-(2,4,6-trimethylphenyl)-2-propen-1-ol
3,3-(di-[2,4,6-trimethylphenyl])-2-propen-1-ol
3-phenyl-3-(4-methylphenyl)-2-propen-1-ol
3,3-diphenyl-2-propen-1-ol
3-(2-chlorophenyl)-2-propen-1-ol
3-(3-chlorophenyl)-2-propen-1-ol
3-(4-chlorophenyl)-2-propen-1-ol
3-(2,4-dichlorophenyl)-2-propen-1-ol
3-(2-bromophenyl)-2-propen-1-ol
3-bromo-3-phenyl-2-propen-1-ol
3-chloro-3-phenyl-2-propen-1-ol
3-((4-nitrophenyl)-2-propen-1-ol
3-(2-nitrophenyl)-2-propen-1-ol
3-(3-nitrophenyl)-2-propen-1-ol
2-methyl-3-phenyl-2-propen-1-ol
2-methyl-3-(4-chlorophenyl)-2-propen-1-ol
2-methyl-3-(4-nitrophenyl)-2-propen-1-ol
2-methyl-3-(4-aminophenyl)-2-propen-1-ol
2-methyl-3,3-diphenyl-2-propen-1-ol
2-ethyl-1,3-diphenyl-2-propen-1-ol
2-ethoxymethylene-3-phenyl-2-propen-1-ol
2-phenoxy-3-phenyl-2-propen-1-ol
2-(2-methoxy-4-methylphenoxy)-3-(3-methoxy-4-hydroxyphenyl)-2-propen-1-ol
2-methyl-3-(4-methoxyphenyl)-2-propen-1-ol
2,3-diphenyl-2-propen-1-ol
1,2,3-triphenyl-2-propen-1-ol
2,3,3-triphenyl-2-propen-1-ol
2-ethoxy-3-phenyl-2propen1-ol
1,3-diphenyl-2-propen-1-ol
1-(4-methylphenyl)-3-phenyl-2-propen-1-ol
1-phenyl-3-(4-methylphenyl)-2-propen-1-ol
1-phenyl-3-(4-methoxyphenyl)-2-propen-1-ol
1-(4-methoxyphenyl)-3-phenyl-2-propen-1-ol
1,3-di(4-chlorophenyl)-2-propen-1-ol
1-(4-bromophenyl)-3-phenyl-2-propen-1-ol
1-phenyl-3-(4-nitrophenyl)-2-propen-1-ol
1,3-di-(2-nitrophenyl)-2-propen-1-ol
1-(4-dimethylaminophenyl)-3-phenyl-2-propen-1-ol
1-phenyl-3-(4-dimethylaminophenyl)-2-propen-1-ol
1,1-di-(4-dimethylaminophenyl)-3-phenyl-2-propen-1-ol
1,1,3-triphenyl-2-propen-1-ol
1,1,3,3-tetraphenyl-2-propen-1-ol
1-(4-methylphenyl)-3-phenyl-2-propen-1-ol
1-(dodecylsulfonyl)-3-phenyl-2-propen-1-ol
1-phenyl-2-propen-1-ol
1,2-diphenyl-2-propen-1-ol
1-phenyl-2-methyl-2-propen-1-ol
1-cyclohexyl-2-propen-1-ol
1-phenoxy-2-propen-1-ol
2-benzyl-2-propen-1-ol
1,1-di-(4-chlorophenyl)-2-propen-1-ol
1-carboxy-2-propen-1-ol
1-carboxyamido-2-propen-1-ol
1-cyano-2-propen-1-ol
1-sulfo-2-propen-1-ol
2-ethoxy-2-propen-1-ol
2-amino-2-propen-1-ol
3-(3-amino-4-methoxyphenylsulfonyl)-2-propen-1-ol
3-(4-methylphenylsulfonyl)-2-propen-1-ol
3-phenylsulfonyl-2-propen-1-ol
3-benzylsulfonyl-2-propen-1-ol
3-anilinosulfonyl-2-propen-1-ol
3-(4-methoxyanilinosulfonyl)-2-propen-1-ol
3-anilino-2-propen-1-ol
3-naphthylamino-2-propen-1-ol
3-phenoxy-2-propen-1-ol
3-(2-methylphenyl)-2-propen-1-ol
3-(3-methylphenoxy)-2-propen-1-ol
3-(2,4-dimethylphenyl)-2-propen-1-ol
1-methyl-3-carboxy-2-propen-1-ol
3-carboxy-2-propen-1-ol
3-bromo-3-carboxy-2-propen-1-ol
1-carboxy-3-chloro-3-methyl-2-propen-1-ol
1-carboxy-3-methyl-2-propen-1-ol
1-(2-carbethoxyisopropyl)-3-methyl-2-propen-1-ol
1-(1-carbethoxypropyl)-2-propen-1-ol
1-(1-carbethoxyethyl)-3-methyl-2-propen-1-ol
1-carbethoxy-3-chloro-3-methyl-2-propen-1-ol
1-carbethoxymethylene-3-methyl-2-propen-1-ol
1-amido-2,3-dimethyl-2-propen-1-ol
1-cyano-3-methyl-2-propen-1-ol
3-sulfo-2-propen-1-ol
3-butoxy-2-propen-1-ol
1-cyclohexyl-3-(2-hydroxycyclohexyl)-2-propen-1-ol
3-cyclopentyl-2-propen-1-ol
3-furyl-2-propen-1-ol
3-chloro-2-propen-1-ol
3-bromo-2-propen-1-ol
2-methyl-3-chloro-2-propen-1-ol
2-methyl-3-bromo-2-propen-1-ol
1-carboisobutoxy-3-chloro-3-methyl-2-propen-1-ol
3-phenyl-2-propenyl-1-amine (cinnamyl amine)
1,1-di-(3-phenyl-2-propenyl)-amine (dicinnamyl amine)
1-methyl-1-(3-phenyl-2-propenyl)-amine
1-ethyl-1-(3-phenyl-2-propenyl)-amine
1-phenyl-1-(3-phenyl-2-propenyl)-amine
1-(2-propenyl)amine (allyl amine)
1,1-di-(2-propenyl)-amine (diallyl amine)
1-methyl-1-(3-chloro-2-propenyl)-amine
1-(3-methyl-2-propenyl)-amine
1-phenyl-1-(2-propenyl)-amine
1-ethyl-1-(2-propenyl)-amine
1-propyl-2-(2-propenyl)-amine
1-methyl-1-(2-propenyl)amine
3-phenyl-2-propen-1-mercaptan
2-propenyl sulfide
2-propen-1-thiol
3-bromo-2-propen-1-thiol The maleic anhydride copolymers used in preparing light-sensitive polymers of this invention have, in general, substantially equimolar proportions of maleic anhydride and an ethylenically unsaturated monomer polymerizable therewith. Some typical copolymers suitable for preparation of the light-sensitive polymers of this invention, their mol ratios and relative viscosities are given in the table below:

| Copolymer | Mol ratio | Relative viscosity |
|---|---|---|
| Methyl vinyl ether/maleic anhydride | 1:1 | [1] 4.0 |
| n-Butyl vinyl ether/maleic anhydride | 1:1 | [1] 2.2 |
| Do | 1:1 | [1] 1.59 |
| Isobutyl vinyl ether/maleic anhydride | 1:1 | [1] 3.93 |
| Do | 1:1 | [1] 1.66 |
| Octadecyl vinyl ether/maleic anhydride | 1:1 | [1] 1.91 |
| Isoctyl vinyl ether/maleic anhydride | 1:1 | [1] 1.91 |
| Dodecyl vinyl ether/maleic anhydride | 1:1 | [1] 1.52 |
| Cetyl vinyl ether/maleic anhydride | 1:1 | [1] 1.20 |
| Styrene/maleic anhydride | 1:1 | [1] 2.82 |
| Ethylene/maleic anhydride | 1.5:1 | [2] 2.44 |
| Vinyl pyrrolidone/maleic anhydride | 1:1 | [3] 1.16 |

[1] In 1% methyl ethyl ketone
[2] 1% in $N_2$-methyl-2-pyrrolidinone.
[3] 1% in $H^2O$.

These compounds are prepared by methods such as, for example, those described in U.S. Pat. 2,047,398.

Polymeric acids suitable for preparation of the light sensitive polymers of this invention are prepared by the polymerization of unsaturated acids as, for example, acrylic and methacrylic acid. The polymeric acid halides suitable as intermediates for the light-sensitive polymers of this invention are, in turn, prepared by either the direct polymerization of unsaturated acid halides or by the conversion of the aforesaid polymerized acids into the acid halides, e.g., by reaction with thionyl chloride.

The aforesaid polymers are reacted with the substituted allyl alcohol, amine or mercaptan to yield the corresponding ester, amide or thioester. In general, the reaction is run in either an excess of the substituted allyl compound, in an inert solvent such as 2-methoxyethyl acetate, xylene, acetone, methylethyl ketone, ethanol, toluene or cyclohexanol or, as is the case with the polymeric acid halides, in a reactive solvent which is a hydrogen halide acceptor, such as pyridine. Reaction temperature is dependent on the reactants and their reactivities. Various acid-base catalysts may be employed as needed.

The resulting compounds consist of polymers having a backbone of either a maleic anhydride copolymer, an unsaturated acid polymer or an acid halide polymer such that they have recurring structural units of the general formula:

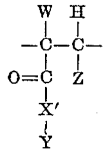

in which W is hydrogen, alkyl, aryl, chlorine or bromine, X′ is oxygen, sulfur or

in which R′ is hydrogen, alkyl, alkenyl or aryl; Y is substituted allyl corresponding to the formula

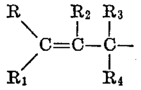

as defined hereinabove; Z is hydrogen, alkyl, alkoxy, aryl, aryloxy, —CO—O—M or —CO—X′—Y in which M is hydrogen, a metal ion, an ammonium ion, a substituted ammonium ion, alkyl or aryl and X′ and Y have the same significance as above. The remaining recurring structural unit of the maleic anhydride copolymer is either an alkyl vinyl ether, ethylene, styrene or vinyl pyrrolidone.

The preferred compounds of this invention include condensation polymers of the following compounds with the maleic anhydride copolymers listed previously: cinnamyl alcohol, cinnamylamine, cinnamyl mercaptan, allyl amine and allyl mercaptan; the products of interesterification, interamidation or interthioesterification of polymers of unsaturated acids especially acrylic acids as, for example, polymethyl acrylate or polymethyl methacrylate by reaction with cinnamyl alcohol, amine or mercaptan or allyl amine or mercaptan; and reaction products of polymers of the unsaturated acid halides as, for example, poly (acrylyl chloride) and poly (methacrylyl chloride) with cinnamyl alcohol, amine or mercaptan or allyl amine or mercaptan.

In the case of maleic anhydride copolymers, a suitable polymer can be prepared by reacting 50 to 100% of the anhydride moiety with the substituted allyl compound, the preferred range being from 70 to 100% reaction.

In the interesterification reaction of polyunsaturated acid esters, and esterification, amidation or thioesterification of polyunsaturated acid halides, suitable photoresists are prepared when 50 percent of the esterified alcohol or halide moiety is replaced by the substituted allyl moiety. The preferred range is 55 to 100% substitution.

The resulting polymers are sensitive to light exposure, particularly in the ultraviolet region, without the use of sensitizers. However, sensitizers can be used to increase the sensitivity, especially in the visible region. Examples of such sensitizer compounds include nitro-anilines as described in U.S. Pat. 2,610,121; quinones, benzanthrones and triphenyl methane dyes as reported in U.S. Pats. 2,670,285; 2,670,286 and 2,690,966; ketone compounds as reported in U.S. Pat. 2,670,287; and 1-methyl-2-benzoylmethylene-β-naphthothiazoline and other arylothiazolines as reported in U.S. Pats. 2,112,139 and 2,732,301.

Several examples are set forth below to illustrate the nature of the invention and the manner of carrying it out. However, the invention should not be considered as limited to the details thereof.

EXAMPLES 1–28

These examples illustrate the synthesis of the substituted allyl half-esters of the maleic anhydride copolymers and of polymeric unsaturated acids or halides.

| Ex. No. | Copolymer: maleic anhydride+ equimolar quantity of— | Quantity of copolymer, g. | Substituted allyl compound | Quantity of allyl compound, g. | Solvent | Reaction Conditions: Temp., °C. | Reaction Conditions: Time hrs. |
|---|---|---|---|---|---|---|---|
| 1 | Methyl vinyl ether | 7.8 | Cinnamyl alcohol | 33.5 | Cinnamyl alcohol | 90–95 | 3 |
| 2 | do | 7.8 | do | 34.2 | do | 90–95 | 3 |
| 3 | do | 15.6 | Cinnamyl amine | 11.4 | Methyl ethyl ketone (150 ml.) | 25–30 | |
| 4 | do | 15.6 | Cinnamyl alcohol | 67 | $CCl_4$ (80 ml.) | 76–78 | 15 |
| 5 | n-butyl vinyl ether | 3.96 | do | 20 | Cinnamyl alcohol | 85 | 2 |
| 6 | do | 3 96. | do | 20 | do | 85 | 2 |
| 7 | Isobutyl vinyl ether | 3.96 | do | 20 | do | 85 | 2 |
| 8 | do | 3.96 | do | 20 | do | 85 | 2 |
| 9 | Octadecyl vinyl ether | 3.57 | do | 20 | Methyl ethyl ketlne (30 ml.) | 85 | 2 |
| 10 | Isoctyl vinyl ether | 2.54 | do | 20 | Cinnamyl alcohol | 90–95 | 3 |
| 11 | Dodecyl vinyl ether | 3.10 | do | 20 | do | 90–95 | 3 |
| 12 | Cetyl vinyl ether | 3.66 | do | 20 | do | 95 | 3½ |
| 13 | Styrene | 2.02 | do | 13.4 | do | 85 | 2 |
| 14 | Ethylene * | 1.38 | do | 13.4 | do | 85–90 | 2 |
| 15 | N-vinyl-2-pyrrolidinone | 10.45 | do | 33.5 | do | 85 | 4 |
| 16 | Methyl vinyl ether | 7.8 | Cinnamyl mercaptan | 37.5 | Cinnamyl mercaptan | 90–95 | 3 |
| 17 | Styrene | 2.02 | do | | do | 90–95 | 3 |
| 18 | Ethylene | 1.38 | do | | do | 90–95 | 3 |
| 19 | N-vinyl-2-pyrrolidinone | 10.45 | do | 37.5 | do | 90–95 | 3 |
| | **Polymer of unsaturated acid ester or halide** | **Quantity of polymer, g.** | | | | | |
| 20 | Poly(methyl acrylate) | 4.3 | Cinnamyl alcohol | 33.5 | Cinnamyl alcohol | 90–95 | 3 |
| 21 | Poly(acrylic chloride) | 4.5 | do | 33.5 | do | 90–95 | 3 |
| 22 | Poly(methacrylic chloride) | 5.2 | do | 33.5 | do | 90–95 | 3 |
| 23 | Poly(methyl acrylate) | 4.3 | do | 34.2 | do | 90–95 | 3 |
| 24 | Poly(acrylic chloride) | 4.5 | do | 34.2 | do | 90–95 | 3 |
| 25 | Poly(methacrylic chloride) | 5.2 | do | 34.2 | do | 90–95 | 3 |
| 26 | Poly(methyl acrylate) | 8.6 | Cinnamyl amine | 11.4 | $C_2H_4Cl_2$ | 80 | 8 |
| 27 | Poly(acrylic chloride) | 9 | do | 11.4 | $C_2H_4Cl_2$ | 5–10 | 2 |
| 28 | Poly(methacrylic chloride) | 10.4 | do | 11.4 | $C_2H_4Cl_2$ | 5–10 | 2 |

* 1 mole maleic anhydride to 1.5 moles of ethylene.

In general, the compounds are prepared by heating the anhydride copolymer, or a polymeric unsaturated acid ester or halide, together with the substituted allyl alcohol, amide or mercaptan in an excess of the substituted allyl compound or in an inert solvent. The table above lists the reactants, their quantities, solvents and reaction conditions. The resulting cinnamyl half-ester polymers were isolated by precipitation with carbon tetrachloride, filtered and prepared for coating by dissolution in suitable organic solvents. The polymers of Examples 1–13 had relative viscosities ranging from 1.2 to 4.0 in 1% solution in methyl ethyl ketone while the polymers of Examples 14 and 15 had relative viscosities of 2.44 and 1.16 in 1% solutions in N-methyl-2-pyrrolidone and water respectively.

EXAMPLE 29

This example illustrates an alternative, improved procedure for the preparation of the cinnamyl half-ester of methyl vinyl ether/maleic anhydride polymers.

Seventy-eight grams (0.5 mole) of a methyl vinyl ether/maleic anhydride copolymer were slowly charged, with stirring, to a reactor containing 450 ml. of methyl ethyl ketone which had been cooled to 0.5° C. The mixture was warmed to room temperature, stirred for approximately 3 hours or until a clear solution was obtained and then 67 grams (0.5 mole) of melted cinnamyl alcohol were charged to the reactor followed, 5 minutes later, by 0.8 grams of N-methyl morpholine in 50 ml. of methyl ethyl ketone. The mixture, after purging with nitrogen, was heated to 100° C. and maintained, under the nitrogen atmosphere, at the aforesaid temperature for 12 hours after which the reactor was cooled to room temperature over a 3 hour period. The resulting methyl ethyl ketone solution of the cinnamyl half-ester of methyl vinyl ether/maleic anhydride was suitable for coating—thereby eliminating the isolation and dissolution steps of the previous procedure.

To illustrate the utility of the aforesaid half-esters as photoresists, films were cast from the solutions of the half-esters of Examples 1–15 and 32, employing standard film techniques using, in particular, a 6 mil film applicator. A glass surface was used as the support; however, the half-esters can be applied to other appropriate substrates, such as copper or zinc.

The coated plates were dried in an oven at 55–60° C. for 10 minutes and were then exposed, through a negative positioned over the plate, for 10 minutes to the radiation from a 450 watt Hanovia quartz lamp positioned 6 inches from the plate and having a 280 mu cut-off Corex filter. Development was effected by washing with a solvent for the unexposed polymer. The table below lists the half-esters evaluated, the coating solvent and the development solvent. Wet film thickness was 6 mils in all cases except for a 3 mil wet film cast from the half-ester of the ethylene/maleic anhydride copolymer. The example numbers correspond to the numbers used earlier and thereby indicate the polymer composition.

| Example No. | Coating solvent | Development solvent |
|---|---|---|
| 1 | Acetone | Acetone. |
| 2 | do | Do. |
| 3 | Ethanol | Ethanol or water. |
| 4 | Methyl ethyl keytone or acetone. | Acetone. |
| 5 | Acetone | Do. |
| 6 | do | Do. |
| 7 | do | Do. |
| 8 | do | Do. |
| 9 | 75 xylene/25 methoxyethyl acetate. | 75 xylene/25 methoxyethyl acetate. |

| Example No. | Coating solvent | Development solvent |
|---|---|---|
| 10 | Acetone | Acetone. |
| 11 | do | Do. |
| 12 | 75 xylene/25 methoxyethyl acetate. | 75 xylene/25 methoxyethyl acetate. |
| 13 | Acetone | Acetone. |
| 14 | do | Do. |
| 15 | 75 chloroform/25 ethanol | 50 choloroform/50 water. |
| 16 | Methyl ethyl ketone | Methyl ethyl ketone. |
| 17 | Acetone | Acetone. |
| 18 | do | Do. |
| 19 | 75 chloroform/25 ethanol | 75 chloroform/25 ethanol. |
| 20 | Methyl isobutyl ketone | Methyl ethyl ketone. |
| 21 | 75 xylene/25 methoxyethyl acetate. | 75 xylene/25 methoxyethyl acetate. |
| 22 | Methyl isobutyl ketone | Methyl isobutyl ketone. |
| 23 | 75 xylene/25 methoxyethyl acetate. | 75 xylene/25 methoxyethyl acetate. |
| 24 | Methyl isobutyl ketone | Methyl isobutyl ketone. |
| 25 | Methyl ethyl ketone | Methyl ethyl ketone. |
| 26 | Methyl isobutyl ketone | Methyl isobutyl ketone. |
| 27 | Methyl ethyl ketone | Methyl ethyl ketone. |
| 28 | 75 xylene/25 methoxyethyl acetate. | 75 xylene/25 methoxyethyl acetate. |
| 29 | Methyl ethyl ketone | Methyl ethyl ketone. |

All of the resulting photoresists were rated good to excellent with the exception of Example 12, where a fair photoresist was formed.

EXAMPLES 30–34

These examples illustrate the effect of sensitizer addition to a cinnamyl half-ester derivative of methyl vinyl ether/maleic anhydride when the photoresist is prepared by exposure to visible light.

For Examples 30 to 33, a sufficient quantity of the cinnamyl half-ester of methyl vinyl ether/maleic anhydride copolymer as prepared in Example 1 above was dissolved in acetone to prepare a 4.5% solution. After addition of a sensitizer, a 3 mil wet film was applied to a glass surface and dried for 10 minutes in an oven at 60° C. A high contrast negative was placed over the coated plate, the plate was then positioned 6 inches from the level of a 35 mm. slide projector and was exposed to the radiation from a 300 watt lamp for 5 minutes. Photoresist development was effected by washing with acetone. In Example 34, a 6 percent solution of the cinnamyl ester of methyl vinyl ether/maleic anhydride was used, after the addition of the sensitizer, to apply a 1 micron film to a glass surface. After drying, the coated surface was exposed, through a step wedge having density increases in 1.414 increments, to the radiation from a 200 watt high pressure mercury vapor lamp with development effected by washing with methyl ethyl ketone. The sensitizers, their quantities and the results are tabulated below.

| Ex. No. | Sensitizer | Concentration based on polymer, percent | Photoresist quality |
|---|---|---|---|
| 30 | Blank | | None. |
| 31 | 1,2-benzoanthraquinon | 5 | Good. |
| 32 | 4,4'bis(dimethylamino) benzophenone. | 5 | Excellent. |
| 33 | 2,4,6-trinitroaniline | 5 | Do. |
| 34 | 1-methyl-2-benzoylmethylene-napthothiazoline. | 10 | Do. |

EXAMPLES 35–38

These examples illustrate not only the superior performance of the light-sensitive polymers of this invention in comparison to that of a commercial polyvinyl cinnamate based photoresist but also the compatibility of said polymers with stabilizers, both in solution and in subsequent photoresist performance.

Three 6 percent solutions of a cinnamyl alcohol ester of methyl vinyl ether-maleic acid copolymer were prepared containing no stabilizer (Example 35), 0.1 percent by weight of polymer of 4-methoxyphenol (Example 36) and 0.1 percent by weight of polymer of 2,6-ditertiary butyl phenol (Example 37). To each solution was added 10 percent by weight of polymer of 1-methyl-2-benzoylmethylene-β-naphthothiazoline sensitizer. One micron thick film on glass surfaces, prepared from the above solutions as well as from the aforesaid commercial photoresist( Example 38), were exposed, through a step wedge having density gradients in 1.414 increments, to the radiation from a 200 watt high pressure mercury vapor lamp. Photoresist development was effected by washing with methyl ethyl ketone. Results are tabulated below:

| | A | B | C | D |
|---|---|---|---|---|
| Example No. | Exposure time, secs. | No. of visible steps after development | Visible step/ unit of exposure time (B/A) | Relative sensitivity (C/0.27) |
| 35 | 5 | 3 | 0.6 | 2 |
| 36 | 5 | 3 | 0.6 | 2 |
| 37 | 5 | 3 | 0.6 | 2 |
| 38 | 15 | 4 | 0.27 | 1 |

These results show that the polymers of this invention are much more sensitive to visible light than the commercial light-sensitive polymer evaluated. At the same time, no deleterious effect due to the stabilizer addition was noted.

The etch resistances of photoresists prepared from the stabilized formulations were rated as excellent on copper surfaces and fair on glass surfaces.

While exemplary embodiments of the invention have been described, the true scope of the invention is to be determined from the following claims.

What is claimed is:

1. A light-sensitive element which comprises a base having a surface coated with a light-sensitive, organic solvent-soluble, film-forming polymer prepared by the reaction of (a) a polymer selected from the class consisting of copolymers of maleic anhydride with a monomer selected from the class consisting of alkyl vinyl ether, ethylene, styrene and vinyl pyrrolidinone; polymers of ethylenically unsaturated carboxy acids, their esters and the corresponding acid halides with (b) a substituted compound having the general formula

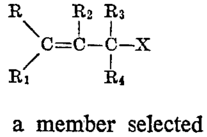

wherein R is a member selected from the class consisting of hydrogen, alkyl of 1 to 3 carbon atoms, aryl, alkyl substituted aryl wherein the substituent has from 1 to 3 carbon atoms, halogen, carboxy and sulfonic acid groups;

$R_1$ is a member selected from the class consisting of hydrogen, aryl, alkyl, alkoxy, aryloxy, aryl substituted with hydroxy, alkyl or alkoxy groups, aryloxy substituted with hydroxy, alkyl or alkoxy groups, aliphatic carboacyl, aliphatic carboacyloxy, aroyl, aroyloxy, cyano, alkyl sulfonyl, aryl sulfonyl and carbalkoxy groups;

$R_2$ is a member selected from the class consisting of hydrogen, alkyl, alkoxy, alkoxymethylene, aryl, aryloxy, alkyl substituted aryl and alkyl substituted aryloxy groups;

$R_3$ and $R_4$ are members selected from the class consisting of hydrogen, aryl, alkyl substituted aryl, alkoxy substituted aryl, chloro, bromo, nitro, amino and alkyl sulfonyl groups; and when R and $R_1$ are members selected from the class consisting of hydrogen and alkyl, at least one of the radicals $R_2$, $R_3$ and $R_4$ is a substituent other than a member selected from this class consisting of hydrogen and alkyl; and X is a member selected from the class consisting of hydroxy, amino, monoalkylamino, monoalkenylamino, monoacylamino and mercapto groups, such that the resulting polymer consists of from 25 to 50 mol percent of recurring structural units having the general formula:

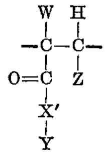

wherein W is a member selected from the class consisting of hydrogen, alkyl, aryl, chlorine and bromine;

X′ is a member selected from the class consisting of oxygen, sulfur and

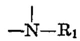

wherein $R_1$ is a member selected from the class consisting of hydrogen, alkyl, alkenyl and aryl;

Y is a substituted allyl group of the general formula

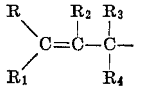

wherein R, $R_1$, $R_2$, $R_3$ and $R_4$ have the significance as detailed above and Z is a member selected from the class consisting of hydrogen, alkyl, alkoxy, aryl, aryloxy, —COOM and CO—X′—Y wherein X′ and Y have the significance as detailed above and M is a member selected from the class consisting of hydrogen, a metallic ion, ammonium ion, substituted ammonium ion, alkyl and aryl and the remaining recurring structural units of the polymer being the polymerized moiety selected from the class consisting of (a) above, said resulting polymer being the sole light-sensitive component of said composition.

2. A light-sensitive element as defined in claim 1 wherein said resulting polymer is a cinnamyl alcohol ester of an alkyl vinyl ether-maleic acid copolymer.

3. A light-sensitive element as defined in claim 1 wherein said resulting polymer is a cinnamyl alcohol ester of a methyl vinyl ether-maleic acid copolymer.

4. A light-sensitive element as defined in claim 1 wherein said resulting polymer is a cinnamyl alcohol ester of a styrene-maleic acid copolymer.

5. A light-sensitive element as defined in claim 1 wherein said resulting polymer is a cinnamyl alcohol ester of an N-vinyl pyrrolidone-maleic acid copolymer.

6. A light-sensitive element as defined in claim 1 wherein said element contains a sensitizer selected from the group consisting of 1,2-benzoanthraquinone, 4,4′-bis(dimethylamino)benzophenone, 2,4,6-trinitroaniline and 1-methyl-2-benzoylmethylene-β-naphthothiazoline.

7. A method for preparing a photoresist which comprises (a) coating a surface with a solution of a light-sensitive, organic solvent-soluble, film-forming polymer as defined in claim 1, (b) drying the coating, (c) exposing the coated surface to light through a negative and (d) developing the photoresist by dissolution of the unexposed polymer in an organic solvent.

8. A method as described in claim 7 wherein the light-sensitive, organic solvent-soluble, film-forming polymer is a cinnamyl alcohol ester of a methyl vinyl ether-maleic acid copolymer.

9. A method as described in claim 7 wherein a sensitizer selected from the class consisting of 1,2-benzoanthraquinone, 4,4' - bis(dimethylamino)benzophenone, 2,4,6-trinitroaniline and 1-methyl-2-benzoylmethylene-β-naphthothiazoline is included in the solution of the film-forming polymer.

10. A coating composition for application to a base which comprises a solution of a light-sensitive, organic solvent-soluble, film forming polymer, as defined in claim 1, in a volatile organic solvent.

11. A coating composition as defined in claim 10 in which the cinnamyl alcohol ester of methyl vinyl ether-maleic acid copolymer is dissolved in acetone.

12. A coating composition as defined in claim 10 in which the cinnamyl alcohol ester of styrene-maleic acid copolymer is dissolved in acetone.

13. A coating composition as defined in claim 10 in which the cinnamyl alcohol ester of an N-vinyl pyrrolidone maleic acid copolymer is dissolved in a chloroform-ethanol solvent mixture.

14. A coating solution as defined in claim 10 wherein a sensitizer selected from the class consisting of 1,2-benzoanthraquinone, 4,4' - bis(dimethylamino)benzophenone, 2,4,6-trinitroaniline and 1-methyl-2-benzoylmethylene-β-naphthothiazoline is included in the solution of the film-forming polymer.

References Cited

UNITED STATES PATENTS

| | | | |
|---|---|---|---|
| 2,980,534 | 4/1961 | Printy et al. | 96—35.1 |
| 2,990,281 | 6/1961 | Printy et al. | 96—35.1 |
| 3,376,138 | 4/1968 | Giangualano et al. | 96—35.1 |

RONALD H. SMITH, Primary Examiner

U.S. Cl. X.R.

96—115